(12) United States Patent
Lizotte et al.

(10) Patent No.: US 6,909,735 B2
(45) Date of Patent: Jun. 21, 2005

(54) SYSTEM AND METHOD FOR GENERATING AND CONTROLLING MULTIPLE INDEPENDENTLY STEERABLE LASER BEAM FOR MATERIAL PROCESSING

(75) Inventors: Todd E. Lizotte, Manchester, NH (US); Orest Ohar, Hooksett, NH (US)

(73) Assignee: Hitachi Via Mechanics, Ltd., Ebina (JP)

( * ) Notice: Subject to any disclaimer, the term of this patent is extended or adjusted under 35 U.S.C. 154(b) by 73 days.

(21) Appl. No.: 10/411,571

(22) Filed: Apr. 10, 2003

(65) Prior Publication Data

US 2004/0200815 A1 Oct. 14, 2004

(51) Int. Cl.[7] ............................ H01S 3/00; G02B 26/08
(52) U.S. Cl. ...................... 372/109; 359/196; 359/223; 359/225; 359/226; 359/618; 359/629
(58) Field of Search ..................... 372/109, 9; 359/196, 359/223, 225, 226, 618, 629, 290, 291; 385/15, 16, 17, 18

(56) References Cited

U.S. PATENT DOCUMENTS

| 5,010,232 A | 4/1991 | Arai et al. ............... 219/121.7 |
| 6,407,363 B2 | 6/2002 | Dunsky et al. ......... 219/121.71 |
| 6,433,301 B1 | 8/2002 | Dunsky et al. ......... 219/121.67 |
| 6,531,677 B2 | 3/2003 | Arai et al. ............. 219/121.71 |
| 6,610,960 B2 | 8/2003 | De Steur et al. ........ 219/121.71 |
| 6,696,008 B2 * | 2/2004 | Brandinger ................. 264/400 |
| 6,791,694 B2 * | 9/2004 | Pezeshki ..................... 356/519 |
| 2003/0213787 A1 | 11/2003 | Dunsky et al. ......... 219/121.75 |

* cited by examiner

Primary Examiner—Don Wong
Assistant Examiner—Leith Al-Nazer
(74) Attorney, Agent, or Firm—Davis & Bujold, P.L.L.C.

(57) ABSTRACT

A laser process system with multiple, independently steerable laser beamlets and including a laser and beam shaper for generating a shaped source beam, a splitter stage for generating a plurality of beamlets from the shaped source beam, a beamlet controller including an independently steerable beamlet steering mirror for and corresponding to each beamlet for independently directing the corresponding beamlet, a mirror controller for controlling each beamlet steering mirror, and an optical path including a scanning lens for directing each steered beamlet to a target area of a workpiece. Each beamlet steering mirror is a multi-axis micro-electro-mechanical mirror and the system further includes a beam dump located in the optical path for intercepting a beamlet steered into the beam dump by the corresponding beamlet steering mirror.

3 Claims, 5 Drawing Sheets

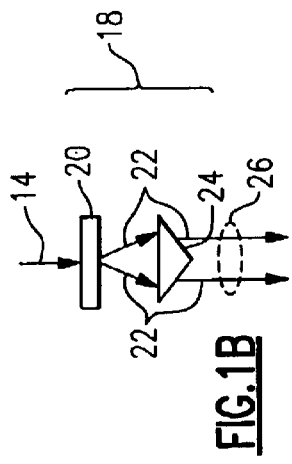
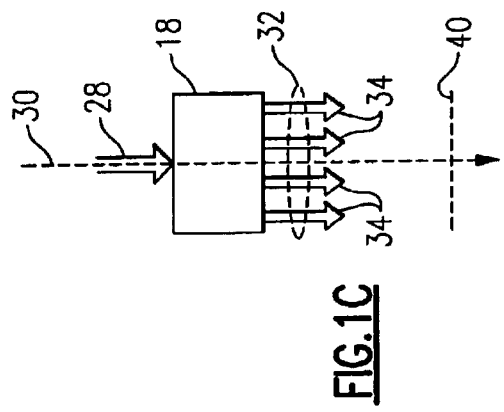
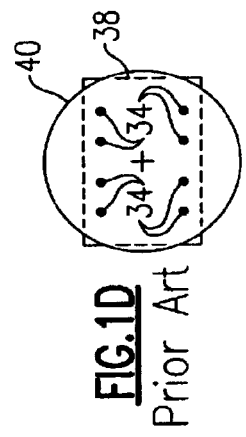
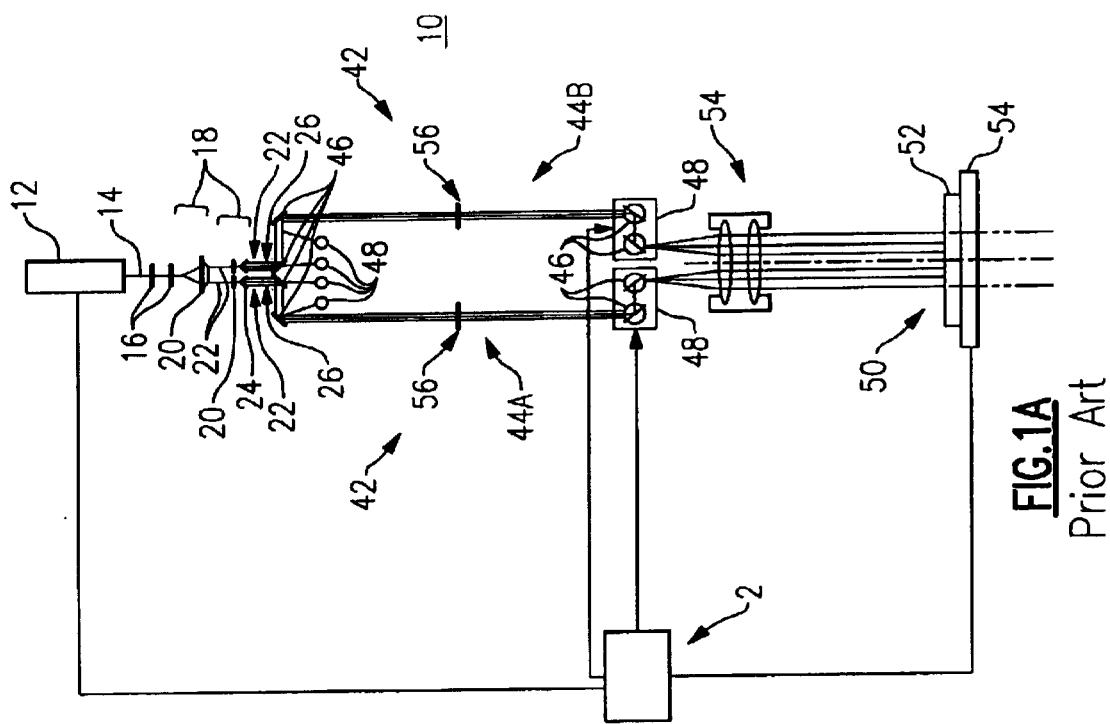
FIG. 1B
FIG. 1C
FIG. 1D
Prior Art
FIG. 1A
Prior Art

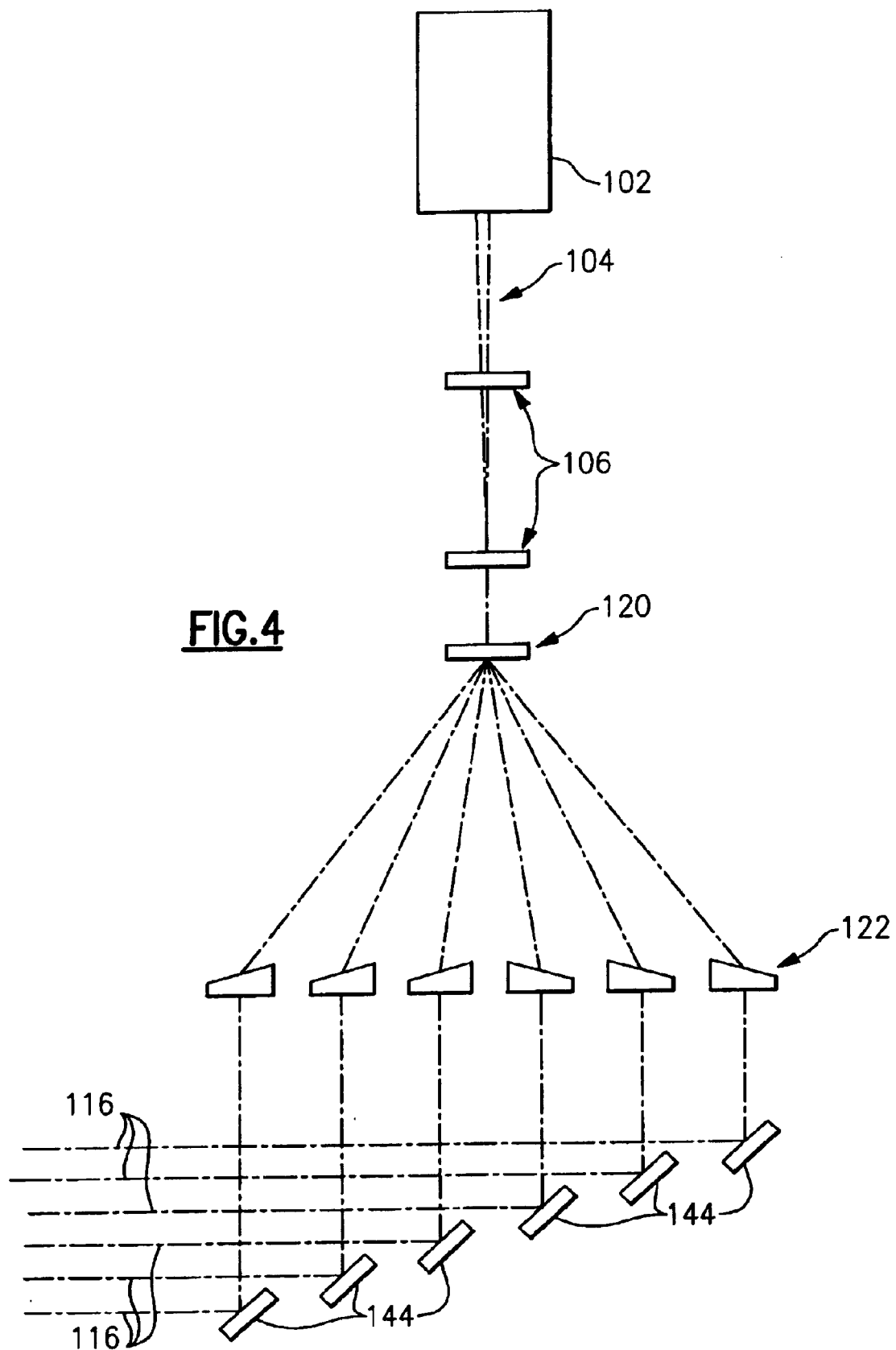

SYSTEM AND METHOD FOR GENERATING AND CONTROLLING MULTIPLE INDEPENDENTLY STEERABLE LASER BEAM FOR MATERIAL PROCESSING

FIELD OF THE INVENTION

The present invention relates to a method and apparatus for generating and directing multiple independent laser beams for use in material processing.

BACKGROUND OF THE INVENTION

Focused and directed laser beams are commonly used for a variety of processes, such as drilling of blind, through and micro-vias, laser imaging, dicing of substrates and modification or customization of integrated circuits, drilling, cutting, and selective material removal and other complex machining and micro-machining operations involving materials such as thin metals, polymers, integrated circuits and substrates. Certain such processes are referred to as "focal point machining", wherein the object is generally to focus and concentrate the energy of one or more laser beans to converge at a desired spot, or as "laser imaging", wherein the objective is to image an apertured area of a laser beam onto the surface of an object. Such processes have become very complex, often involving the concurrent or sequential of use of single or multiple lasers or multiple types of lasers, such as visible, infra-red (IR) and ultraviolet (UV) lasers, in concurrent or sequential operations.

Such processes, however, are faced with a number of recurring and related problems. For example, a given operation, such as the drilling of a via or the micro-machining of an integrated circuit or a machine part often requires only a part of the power of a laser beam, so that much of the power of a laser is underutilized. This problem is related to still another problem, which is the time required to perform operations on a given workpiece. That is, many of the processes employing lasers, such as drilling vias in a circuit board, substrate or integrated circuit or performing machining operations on a integrated circuit or mechanical part require a very large number of operations and a correspondingly long time to complete a given workpiece.

The general solution to both problems is well known and understood, however, and includes method for splitting a single laser beam into multiple sub-beams, or beamlets, which are typically used concurrently to perform multiple, identical operations in parallel.

In a typical laser process system of the prior art employing these methods, a source beam generated by a laser is passed through one or more splitter stages, each of which includes a splitter which divides a single source beam into two or more beamlets, and a collimating prism associated with each splitter which directs and focuses the beamlets from the splitter into a group of parallel beamlets. The splitting and collimating process may be repeated sequentially to generate the desired number of beamlets in each group, and the desired number of groups of beamlets. Each group of beamlets then passes through a "path equalizer", each of which is comprised of a transmission path through multiple galvanometer controlled mirrors arranged and controlled to equalize the length that each beamlet traverses in reaching the target, or workpiece. A final pair of steerable mirrors for each group of beamlets and a scan lens shared among the groups of beamlets then permits the groups of parallel beamlets to be "steered" and focused in parallel onto a desired target area of the workpiece. Lastly, the equalization paths may include "beam dumps" whereby each group of parallel beamlets may be steered so that one or more beamlets of a group are intercepted by a mask or absorbing element and thereby "dumped", or eliminated, from the group.

While these methods are in common use, a continuing problem with such systems, for example, is that while the steerable mirrors in the beam transmission paths generally permit each group of beamlets to be steered independently of the other groups, the pattern of beamlets within each group are generally constrained to such fixed patterns of parallel beamlets as may be generated by one or more splitter stages. That is, and although the spacing between beamlets in a group can be controlled to a degree by the steerable mirrors in the transmission path and although some beamlets may be eliminated from a group by steering them into a beam dump, the beamlets within a group may not be individually steered to desired targets.

As such, and unless the pattern of targets, such as a layout of vias to be drilled, coincides with the available patterns of beamlets in a group, it will be necessary to eliminate at least some beamlets from a group, by beam dumping, for example, to avoid drilling unwanted vias. As a consequence, a significant portion of the efficiency of the system as regards usage of the available laser power may be negated by the need to "dump" a significant portion of the beamlets. Also, the time required to process a workpiece may increase significantly due to the reduction in the number of beamlets available in each work step and the consequent increase in the required number of work steps.

SUMMARY OF THE INVENTION

The present invention is directed to a laser process system for performing a process on a workpiece with multiple, independently steerable laser beamlets. The laser process system of the present invention includes a laser and beam shaper for generating a shaped source beam, a splitter stage for generating a plurality of beamlets from the shaped source beam, and a beamlet controller, including an independently steerable beamlet steering mirror for and corresponding to each beamlet for independently directing the corresponding beamlet, a mirror controller for controlling each beamlet steering mirror, and an optical path including a scanning lens for directing each steered beamlet to a target area of a workpiece.

Each beamlet steering mirror is a multi-axis micro-electro-mechanical mirror and is steerable about at least one axis, and id typically steerable about two axis. The laser process system further includes a beam dump located in the optical path for intercepting a beamlet steered into the beam dump by the corresponding beamlet steering mirror.

BRIEF DESCRIPTION OF THE DRAWINGS

The invention will now be described, by way of example, with reference to the accompanying drawings in which:

FIG. 1A is a diagrammatic representation of a laser process system of the prior art;

FIG. 1B is a diagrammatic representation of a laser beam splitter followed by a beam collimator;

FIG. 1C is a diagrammatic representation of a generalized splitter stage;

FIG. 1D is a generalized diagram of a pattern of beamlets generated by a laser process system of the prior art;

DESCRIPTION OF THE PREFERRED EMBODIMENT(S)

Figure 2:
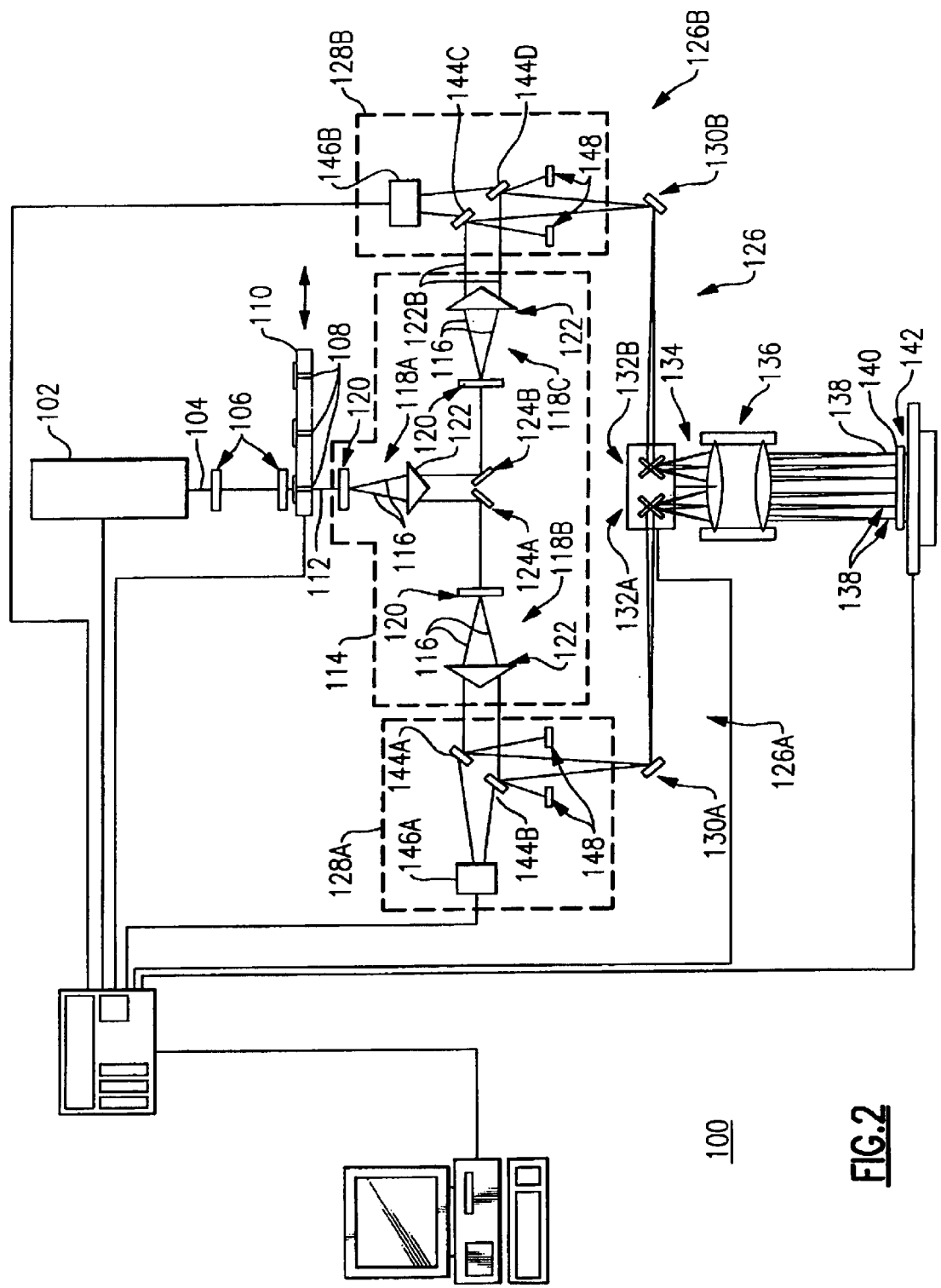
FIG. 2 is a diagrammatic representation of a laser process system of the present invention.

A. Brief Introduction to Prior Art Systems (FIGS. 1A and 1B)

The general structure and operation of laser process systems of the prior art may be illustrated with reference to FIGS. 1A through 1D, as may the distinctions between the systems of the prior art and the present invention.

As represented in FIGS. 1A through 1D, a Laser Process System 10 of the prior art will include a Laser 12 generating a Source Beam 14 which may be in the visible light range or in the ultraviolet (UV) or infra-red (IR) ranges. Source Beam 14 is passed through one or more Shaper Stages 16, which shape and form the Source Beam 14, and then through one or more Splitter Stages 18. Each Splitter Stage 18 includes a Splitter 20 which divides each input beam, such as a Source Beam 14, into two or more Beamlets 22 and which may be comprised, for example, of a prism as illustrated or of a half reflecting mirror that generates a reflected beam and a transmitted beam, each of which is a Beamlet 22. The Splitter Stage 18 also and usually includes an associated Collimating Prism 24, which redirects the Beamlets 20 from the Splitter 20 into a Group 26 of parallel Beamlets 22. As indicated in FIG. 1A, a System 10 may include two or more Splitter Stages 18, each splitting and collimating an input beam or input beams received from, for example, a Laser 12 or a preceding Splitter Stage 16, to generate the desired number of Beamlets 22 in each Group 26, and the desired number of Groups 26 of Beamlets 22.

In this regard, and referring to FIG. 1C, it must be noted at this point that a typical Splitter Stage 18 receives an Input Beam 28, which may be a Source Beam 14 or a Beamlet 22, along an Input Axis 30 and will generate an output Group 32 containing a plurality of Output Beams 34. The axis of each of Output Beams 34 will parallel to a single Output Axis 36 and thereby parallel to the axis of each other Output Beam 34 and will form a Pattern 38 in a Pattern Plane 40 transverse to Output Axis 36, an illustration of which is shown in FIG. 1C. As will be discussed in the following, each Group 32 of Output Beams 34, that is, each Group 26 of Beamlets 22, is directed and guided through the optics of the System 10 as a group of parallel beamlets rather than as individual beamlets, which significant limits the adaptability of the Pattern 38 of Beamlets 22 to various patterns of target areas on a workpiece.

Referring again to FIG. 1A, each Group 26 of Beamlets 22 passes from Splitter Stages 18 and through an Path Equalizer 42 comprised of two Equalization Branch Paths 44, designated as Equalization Branch Paths 44A and 44B. Each Group 26 of Beamlets 22 is steered through an Equalization Branch Path 44A or 44B by multiple Steerable Mirrors 46, each of which is controlled by a Galvanometer 48. As is known in the relevant arts, the function of an Path Equalizer 42 is to equalize the path length that each Beamlet 20 traverses in reaching a Target Area 50 of Workpiece 52.

Lastly, final pairs of Steerable Mirrors 46 along Equalization Branch Paths 44A and 44B and a Scan Lens 54, which is shared by Equalization Branch Paths 44A and 44B and which is a common termination of Equalization Branch Paths 44, steer and focus the Groups 26 of Beamlets 22 onto the Target Areas 50 of the Workpiece 52. In this regard, and as illustrated, Workpiece 52 is typically positionable tranversely to the final Pattern 38 of Beamlets 22, that is, along the horizontal plane, by means of an X-Y Table 54, and certain of Tables 54 also allow positioning along the vertical Z axis.

Lastly, each Equalization Branch Paths 44A and 44B may each include a Beam Dumps 56 whereby each Group 26 of parallel Beamlets 22 traversing an Equalization Branch Path 44 may be steered so that one or more Beamlets 22 of the Group 26 are intercepted by a masking or absorbing element of a Beam Dump 40, thereby "dumping", or eliminating, Beamlets 22 from the Group 26.

It must now be noted that each of the Groups is directed along a path to the Target Area 34 by one or more Steerable Mirrors 46 as a group. That is, all Beamlets 22 of each Group 26 are reflected from each Steerable Mirror 46 as a group and at the same angle of incidence and reflection, and therefore remain parallel to each other and in the same relative positions to with respect to each other in Pattern Plane 40. The sole effects of each redirection of a Group 26 of Beamlets 22 by a Steerable Mirror 46 are thereby to redirect the entire Group 26 of Beamlets 20 along a new axis and to possibly alter the spacing between Beamlets 20 across the Pattern Plane 40, as will be apparent from the geometry of the angles of incidence and reflection of a mirror. It will also be apparent tht any change in the spacing between the Beamlets 22 of a Group 26 across the Pattern Plane 40 will, however, be linearly proportionate in direction and magnitude among all of the Beamlets 22 of the Group 26. Stated another way, a Group 26 will be "steerable" as a group and the dimensions of the Pattern 38 of a Group 26 will be proportionately variable, but the individual Beamlets 22 within a Group 26 are not "steerable" within the Group 26.

As a result, therefore, and while the transverse Pattern 38 of the Beamlets 22 of a Group 26 may be expanded or contracted about a transverse axis, the Pattern 38 in itself cannot be changed except by "dumping" one or more Beamlets 22 by means of a Beam Dump 56. If, therefore and for example, a Pattern 38 of Beamlets 22 in a Group 26 does not match a pattern of Target Areas 50 to be operated upon by the Beamlets 22, the Beamlets 22 of the Group 26 must be reduced by dumping of Beamlets 22 until the Pattern 38 of remaining Beamlets 22 match at least some of the Target Areas 50.

In this regard, it should be noted that a Beam Dump 56 will typically "clip" pattern of Beamlets 22 of a Group 26 along a fixed line, usually straight, so that the ability to select the Beamlets 22 to be dumped is still further restricted. Also, the "clipping line" may not be optimally oriented with respect to the pattern of Beamlets 22 and the pattern of Target Areas 50. As such, the "dumping" of Beamlets 22 to adapt the pattern of Beamlets 22 to a pattern of Target Areas 50 may result in the use of far fewer Beamlets 22 than are potentially available, with corresponding decreases in the efficiently of use of the power available in the Source Beam 14 and increases in the time required to complete the desired operations.

B. Description of the Invention (FIGS. 2A and 2B)

Referring now to the present invention, it will be noted that the following descriptions employ reference numbers 100 and higher to assist in delineating discussions of the present invention from the above discussion of the prior art, which employs reference numbers in the range of 10 through 56.

As will be described in the following discussions, a Laser Process System 100 of the present invention which addresses the above discussed problems of the prior art by providing independently steerable Beamlets 22, among other features.

An exemplary Laser Process System 100 of the present invention includes is illustrated in FIGS. 2A and 2B wherein FIG. 2A is a two dimensional diagrammatic view of a system and FIG. 2B is a generally perspective three dimensional view provided to assist in understanding the following discussions.

As illustrated in FIGS. 2A and 2B, at least one Laser 102, which may be, for example, a visible light, infra-red (IR) or ultraviolet (UV) laser. A System 100 may include a plurality of Lasers 102 of different types, either to provide flexibility in the type of laser used in a process or to allow concurrent or sequential operations by more than one type of laser or more than one laser. The exemplary Laser Process System 100 discussed in the following illustrative discussions and descriptions of the present invention will, however, be shown with one Laser 102 for purposes of simplicity and clarity.

As shown, Laser 102 generates a Source Beam 104 which passes through one or more Beam Shapers 106 and an Aperture 108 of a Selectable Aperture Array 110 to form a Shaped Source Beam 112. Shaped Source Beam 112 then passes through a Multi-Stage Splitter 114, each stage of which generates multiple Beamlets 116 from Source Beam 112 or from an input Beamet 116 from a preceding splitter stage.

Multi-Stage Splitter 114 is comprised of Splitter Stages 118 arranged in branching sequence so that each Splitter Stage 118 splits an input beam from a preceding stage into two or more output beams, the number of stages depending upon the number of Beamlets 116 generated by each stage and the desired number of Beamlets 116. In the exemplary System 100 shown in FIGS. 2A and 2B, for example, Multi-Stage Splitter 114 is comprised of Splitter Stages 118A, 118B and 118C wherein input Splitter Stage 118A splits Shaped Source Beam 112 into two Beamlets 116. Each of the output Beamlets 116 of Splitter Stage 118A is directed to a corresponding one of second stage Splitter Stages 118B and 118C, each of which splits the respective input Beamlet 116 into two output Beamlets 116.

In the exemplary embodiment illustrated in FIGS. 2A and 2B, each Splitter Stage 118 is comprised of a Splitter 120 followed by a Collimating Prism 122 and each first stage Beamlet 116 output from Splitter Stage 118A is directed through a right angle by a corresponding Fixed Mirror 124A or 124B and to a corresponding one of second stage Splitter Stages 118B and 118C. It will be understood, however, that a Splitter Stage 118 may be constructed in a number of ways, such as with one or more prisms or with a semi-reflective mirror that reflects a part of a beam and transmits a part of the beam, or with a combination of prisms and mirrors. Also, a Splitter Stage 118 may be designed and constructed to generate multiple output beamlets from a single input beam, and a Shaped Source Beam 112 or a Beamlet 116 may be directed or steered by several types of elements, such as mirrors or prisms. It will be further understood that successive Splitter Stages 118 may be constructed in an "in line" arrangement, rather than directing the beams from one stage to a next through successive angles, if sufficient transverse separation can be obtained between the output beamlets so that redirection from one stage to another be means of mirrors or prisms is not required.

As shown in FIGS. 2A and 2B, Multi-Stage Splitter 114 also comprises is the entrance of a Path Equalizer 126 comprised of an Equalization Path 126A and an Equalization Path 126B. As illustrated, each of Equalization Paths 126A and 126B includes a Beamlet Controller 128, designated as Beamlet Controllers 128A and 128B, providing individual steering and "dumping" of the Beamlets 116 from Multi-Stage Splitter 114.

The Beamlet 116 outputs from each of Beamlet Controllers 128A and 128B are directed to corresponding Fixed Mirrors 130A and 130B, which direct the Beamlets 116 through angles to Steering Mirrors 132A and 132B, each of which is a galvanometer controlled mirror. Steering Mirrors 132A and 132B in turn steerably direct the Beamlets 116 into the Entrance Aperture 134 of a single Scan Lens 136, which collimates and focuses the Beamlets 116 onto selected Target Areas 138 on a Work Surface 140 of a Workpiece 142.

Referring again to Beamlet Controllers 128, each Beamlet Controller 128 includes an independently steerable Beamlet Steering Mirror 144 for and corresponding to each input Beamlet 116 from Multi-Stage Splitter 114, Beamlet Steering Mirrors 144 being identified in FIGS. 2A and 2B as Beamlet Steering Mirrors 144A, 144B, 144C and 144D. Each Beamlet Steering Mirror 144 is located in the path of the corresponding individual Beamlet 116 from the Multi-Stage Splitter 114 and is typically comprised of a Micro-Electro-Mechanical (MEM) mirror. The individual Beamlet Steering Mirrors 144 of each Beamlet Controller 128 are individually and separately steered and controlled by a MEM Controller 146, identified as MEM Controllers 146A and 146B, of the corresponding Beamlet Controller 128, so that each Beamlet 116 may be independently controlled and steered.

In this regard, it must be noted that the dimensions of the MEM mirrors comprising Beamlet Steering Mirrors 144 are significantly smaller than the dimensions of galvanometer controlled mirrors, thereby allowing the Beamlet Steering Mirrors 144 to be spaced sufficiently close together along a plane or planes traverse to the axis of each group of Beamlets 116 from Multi-Stage Splitter 114 that a Beamlet Steering Mirror 144 may be located in the path of each such Beamlet 120. As is well known to those of skill in the relevant arts, MEM mirrors are also commonly constructed to be rotatable, or tiltable, about either one or two axes, thereby allowing control of the angle of incidence of each Beamlet 116 with the reflecting face of the corresponding Beamlet Steering Mirror 144 to be controlled with respect to the two axis. This in turn allows the direction of each individual Beamlet 116 to be precisely and individually controlled and, as described, Beamlet Steering Mirrors 144 thereby individually steer the corresponding individual Beamlets 116 from Multi-Stage Splitter 114 at angles and in directions that are individually determined for each individual Beamlet 116 by corresponding control signals from MEM Controllers 146A and 146B.

Further in this regard, it will be noted that each Beam Controller 128 of a Laser Process System 100 includes at least one Beam Dump 148 and may include a separate Beam Dump 148 for and corresponding to each Beamlet 116 handled by the Beam Controller 128. As discussed, a Beam Dump 148 may take the form of a "mask" of absorbent material surrounding the path of a Beamlet 116, so that the Beamlet 116 may be directed into the "mask" by a sufficient deviation along any axis, or of an absorbent trap anywhere along the path of the Beamlet 116, so long as the Beamlet 116 may be steered into the "trap". In the embodiment illustrated in FIGS. 2A and 2B, for example, Beam Dumps 148 are located "downstream" of Beamlet Steering Mirrors 144 and outside the normal steerable paths of each Beamlet 116 so that the individual Beamlets 116 may be steered into the Beam Dumps 148 by the corresponding Beamlet Steering Mirrors 144. FIG. 2A illustrates an embodiment wherein there is an individual Beam Dump 148 for each Beamlet 116, and Beam Dumps 148 are located alongside the optical path. In the embodiment illustrated in FIG. 2B, a Beam Dump 148 shared by several Beamlets 116 surrounds each optical path, so that the Beamlets 116 pass through a "window" in a Beam Dump 148.

As described previously, Beam Dumps 148 are used to reduce the number of Beamlets 116 by, for example, blocking the path of a Beamlet 116 by a "shutter" or by directing the path of a Beamlet 116 into a "trap" of an absorbent material. As also discussed, in systems of the prior art the Beamlets 116 are steered only as groups of Beamlets 116 and the Beamlets 116 of a group are arranged in a fixed pattern within the group, so that Beamlets 116 are removed from the pattern by "clipping" the pattern of Beamlets 116 along a fixed line defined by a mask. Because the Beamlets 116 of a Laser Process System 100 are individually steerable, however, not only can the pattern of Beamlets 116 be adapted and changed at will but the Beamlets 116 can be individually "dumped" by individually steering each selected Beamlet 116 into a collective "dump" or into a Beam Dump 148 that is individual and specific to the selected Beamlet 116.

In summary, therefore, it has been described that in the systems of the prior art each group of beamlets forms a fixed pattern of parallel beamlets that are steered as and only as a group and that the pattern of beamlets can be modified only by beam dumping in the form of "clipping" a group of beams along a fixed straight or curved line. In contrast, in a Laser Process System 100 of the present invention each Beamlet 116 is individually and separately steerable by means of a Beamlet Steering Mirror 144. The Beamlets 116 of a Laser Process System 100 of the present invention are thereby steerable to any point within and across the apertures, or traverse planes, of the optical paths extending from Beamlet Steering Mirrors 144 to Scan Lens 136. As a consequence, each Beamlet 116 may be independently and individually steered to a corresponding freely selected Target Area 138 on a Work Surface 140 of a Workpiece 142. In a like manner, each Beamlet 116 may be individually and separately steered into a Beam Dump 148, so that individual Beamlets 116 can be eliminated from a group of Beamlets 116 regardless of the position of a Beamlet 116 in a group.

Figure 3A:
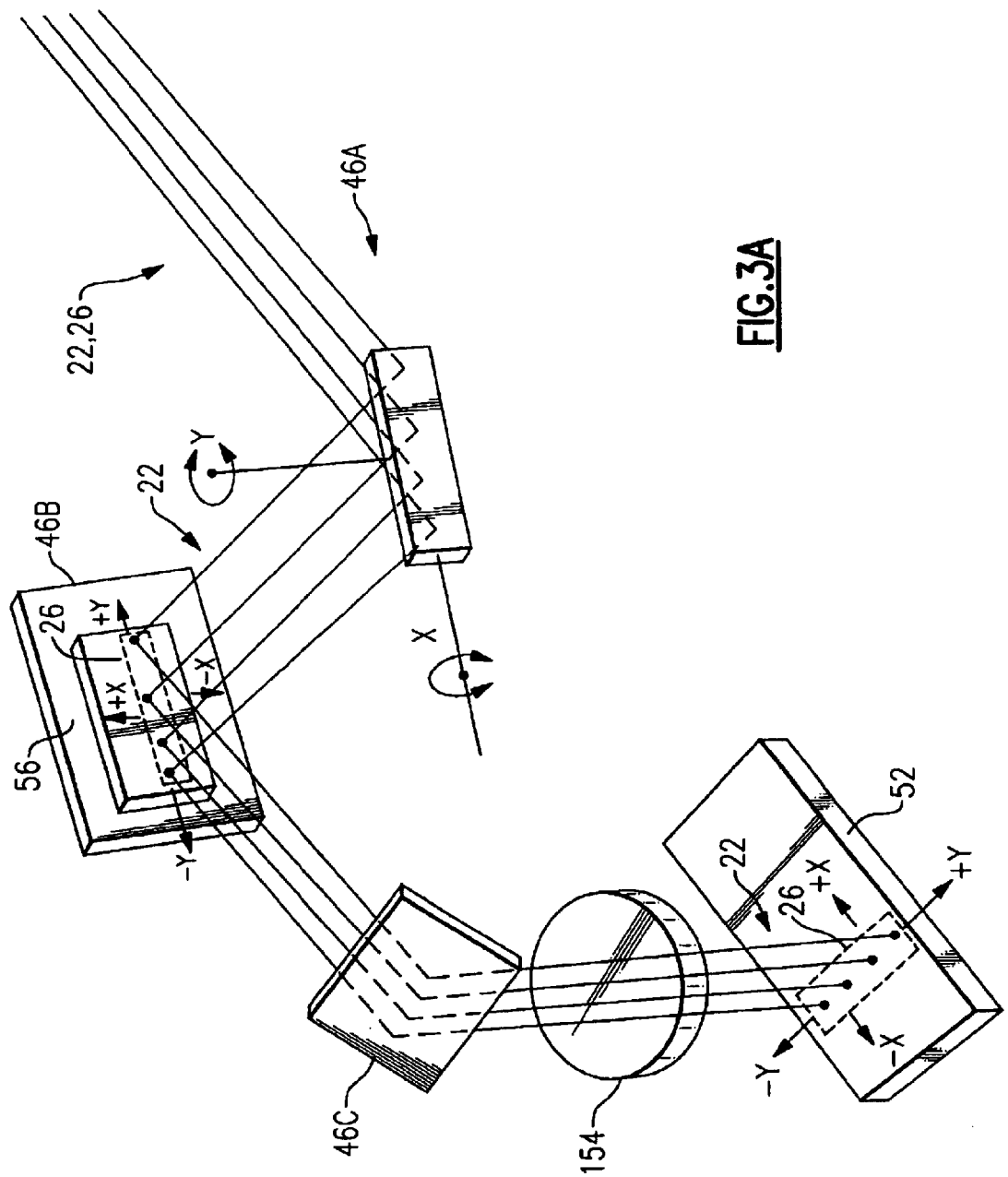
FIG. 3A is a diagrammatic representation of beam steering in a laser process system of the prior art.
Figure 3B:
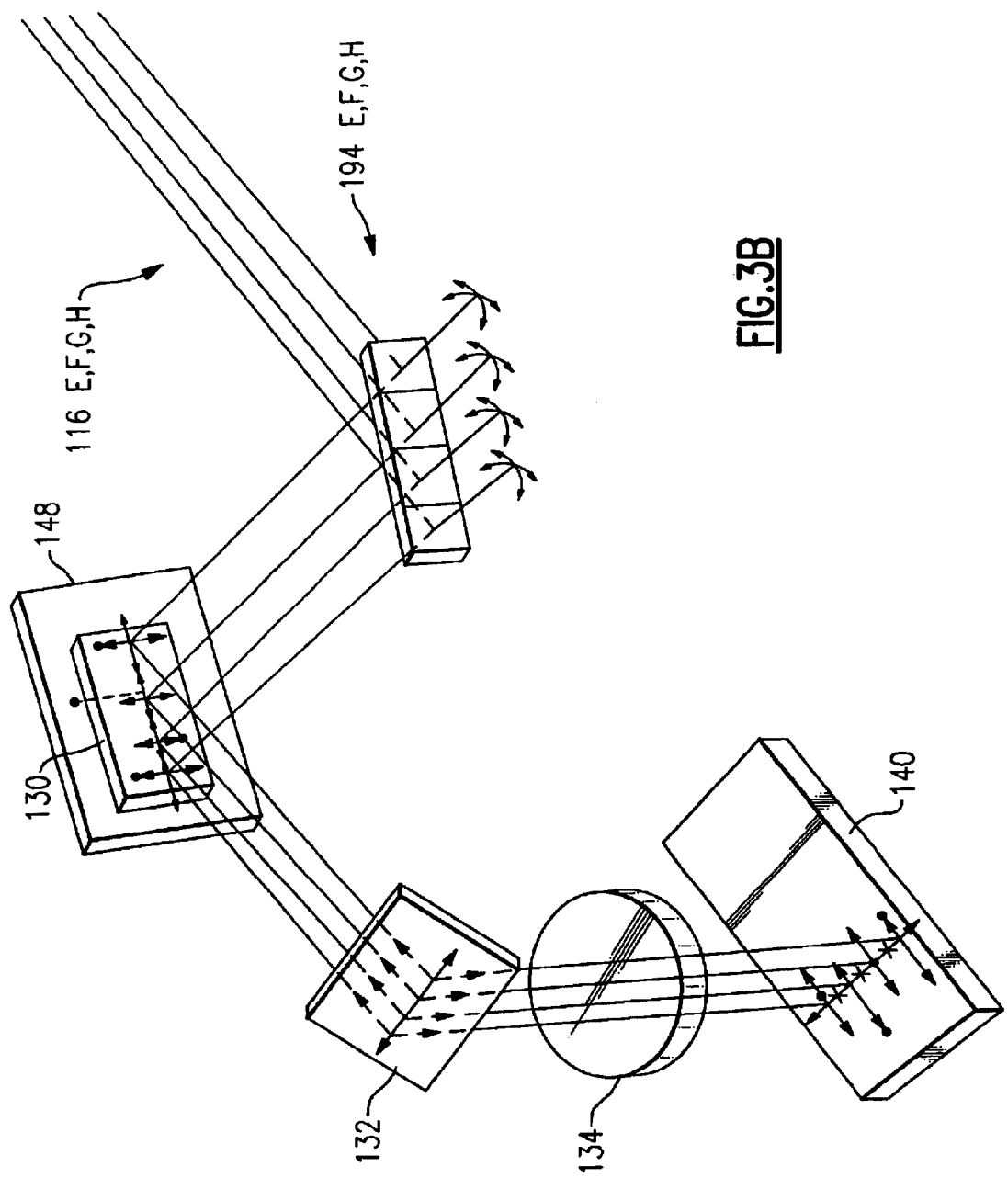
FIG. 3B is a diagrammatic representation of beam steering in a laser process system of the present invention; and, FIG. 4 is a diagrammatic representation of an alternate embodiment of a laser process system of the present invention.

This difference between a Laser Process System 100 of the present invention and a Laser Process System 10 of the prior art, that is, the capability of steering each Beamlet 116 independently and separately of other Beamlets 116 in a group as opposed to steering a Group 26 of Beamlets 22 as and only as a group, is illustrated in FIGS. 3A and 3B FIG. 3A is a partial and simplified representation of a Laser Process System 10 of the prior art and illustrates the control of Beamlets 22 wherein a Group 26 of Beamlets 22 is controlled as and only as a Group 26. As shown, a Group 26 of Beamlets 22 is directed to a Steerable Mirror 46A which is shown as rotatable about two axis, for simplicity and clarity in the present illustration. Steerable Mirror 46A directs the Group 26 of Beamlets 22 through a selectable angle to a next mirror, which may also be a Steerable Mirror 46B, as represented, or a fixed mirror. As indicated, and because Steerable Mirror 46A is steerable, or rotatable, about both the x and y axis, Steerable Mirror 46A may steer or deflect the Group 26 of Beamlets 22 along any or all or any combination of the the +x, +y, −x or −y coordinates or axes with respect to the nominal centerline axis of the Group 26. At some point along the path of the Group 26, and shown in the present illustration as associated with Steerable Mirror 46B, there may be a Beam Dump 56 located such that a sufficiently large deflection of the Group 26 along one of the +x, −x, +y, or −y coordinates or axes will result in one or more of the Beamlets 22 being captured by the Beam Dump 56 and thus eliminated from the Group 26. The Beamlets 22 of a Group 26 proceed through the remainder of the optical path, which will typically include further Steerable Mirrors 46, represented by Steerable Mirror 46C, and a Scan Lens 54, to arrive at the Workpiece 52. It will be apparent that the Group 26 of Beamlets 22 may, however, be steered only as a Group 26 having a fixed Pattern 38, as discussed previously. That is, the Group 26 may be shifted along any of the +x, −x, +y, or coordinates or axes, or along any combination of the +x, −x, +y, or −y coordinates or axes, but only as a Group 26, and the Group 26 itself may be altered only to the extent of "dumping" or"clipping" some Beamlets 22 by such shifting of the Group 26 sufficiently for these Beamlets 22 to intercept a Beam Dump 56.

FIG. 3B is a partial, simplified representation of a Laser Process System 100 of the present invention and it will be seen that a Laser Process System 100 is generally similar to a Laser Process System 10. It will be noted, however, that the single Steerable Mirror 46A has been replaced by a plurality of independently steerable Beamlet Steering Mirrors 144, each of which is an Micro-Electro-Mechanical (MEM) mirror steerable through two axes. As described, therein is a separate Beamlet Steering Mirror 144 for and corresponding to each Beamlet 116, so that each Beamlet 116 can be individually and independently steered along any or all or any combination of the +x, +y, −x or −y coordinates or axes, as illustrated in FIG. 3B. For this reason, not only can each Beamlet 116 be individually positioned within the group of Beamlets 116, but any Beamlet 116 or any combination of Beamlets 116 may be separately and independently steered into a Beam Dump 148. This is illustrated in FIG. 3B wherein one Beamlet 116 from the middle of the group of Beamlets 116 is shown as being steered into the Beam Dump 148. As such, the Beamlets 116 may be individually and independently steered to any location in Target Areas 138 on a Work Surface 140 of Workpiece 142. Again, this is illustrated in FIG. 3B wherein the Beamlets 116 are shown as being steered in an irregular arrangement of Target Areas 138 and wherein the arrangement is comprised of three of the four Beamlets 116, one Beamlet 116 from the middle of the group having been "dumped".

Now considering other exemplary embodiments of a Laser Process System 100 of the present invention, FIG. 4 illustrates an embodiment of a Laser Process System 100 employing a Splitter 120 that generates a plurality of Beamlets 116 from, for example, an input Shaped Source Beam 112 or an input Beamlet 116. In the embodiment illustrated in FIG. 3, for example, Splitter 120 generates six (6) Beamlets 116 from the input beam. Each of Beamlets 116 is received and directed by a corresponding Collimating Prism 122, which may be comprised of a corresponding plurality of Collimating Prisms 122 or of, for example, a diffracting lens, and directed a corresponding two axis Beamlet Steering Mirror 144.

It will be further understood that in further alternate embodiments of a Laser Process System 100 the desired number of Beamlets 116 may be generated by use of sequential or cascaded Splitters 120, and that the operations performed by two axes Micro-Electro-Mechanical (MEM) mirrors may also be performed by use of multiple single axis MEM mirrors.

Since, therefore, certain changes may be made in the above described laser process system without departing from the spirit and scope of the invention herein involved, it is intended that all of the subject matter of the above description or shown in the accompanying drawings shall be interpreted merely as examples illustrating the inventive concept herein and shall not be construed as limiting the invention.

We claim:

1. A laser process system for performing a process on a workpiece with multiple, independently steerable laser beamlets, comprising:

a laser and an image aperture beam shaper for generating a shaped source beam, a splitter stage for generating a plurality of shaped beamlets from the shaped source beam, a beamlet controller, including an independently steerable multi-axis beamlet steering mirror for and corresponding to each shaped beamlet for independently directing the corresponding shaped beamlet, and a mirror controller for controlling each multi-axis beamlet steering mirror, and an optical path including a scanning lens for directing each steered shaped beamlet to a corresponding target area of a workpiece.

2. The laser process system of claim 1, wherein each beamlet steering mirror is a two-axis micro-electro-mechanical mirror.

3. The laser process system of claim 1, further including a beam dump located in the optical path for intercepting a beamlet steered into the beam dump by the corresponding beamlet steering mirror.

* * * * *